United States Patent
Choi et al.

(10) Patent No.: US 11,108,024 B2
(45) Date of Patent: Aug. 31, 2021

(54) DISPLAY APPARATUS HAVING ARBITRARY SHAPE

(71) Applicant: SAMSUNG DISPLAY CO., LTD., Yongin-si (KR)

(72) Inventors: Chulhyun Choi, Yongin-si (KR); Hyungue Song, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/747,862

(22) Filed: Jan. 21, 2020

(65) Prior Publication Data

US 2020/0161587 A1 May 21, 2020

Related U.S. Application Data

(63) Continuation of application No. 15/698,265, filed on Sep. 7, 2017, now Pat. No. 10,541,384.

(30) Foreign Application Priority Data

Dec. 6, 2016 (KR) .......................... 10-2016-0165169

(51) Int. Cl.
*H01L 51/52* (2006.01)
*G06F 3/041* (2006.01)
(Continued)

(52) U.S. Cl.
CPC ........ *H01L 51/5275* (2013.01); *G06F 3/0412* (2013.01); *H01L 27/323* (2013.01);
(Continued)

(58) Field of Classification Search
CPC . H01L 1/5275; H01L 27/3244; H01L 27/323; H01L 51/5253; G02F 1/13338;
(Continued)

(56) References Cited

U.S. PATENT DOCUMENTS 9,718,998 B2 8/2017 Todt et al.
2011/0175102 A1* 7/2011 Hatano ............... H01L 51/5243
257/72

(Continued)

FOREIGN PATENT DOCUMENTS

EP 2423906 2/2012
KR 10-2009-0062939 6/2009

(Continued)

OTHER PUBLICATIONS

Extended European Search Report dated May 4, 2018 for European Patent Application No. 17205314.2.

*Primary Examiner* — Charles V Hicks
(74) *Attorney, Agent, or Firm* — F. Chau & Associates, LLC

(57) ABSTRACT

A display apparatus includes a display panel having a display unit. A touch sensor layer is disposed on the display panel. A window layer is disposed on the touch sensor layer. The window layer has a first refractive index and includes a first surface and a second surface opposite the first surface. An insulation layer is disposed between the window layer and the touch sensor layer. The insulation layer has a second refractive index that is greater than the first refractive index.

26 Claims, 8 Drawing Sheets

(51) Int. Cl.
*H01L 27/32* (2006.01)
*G02F 1/1333* (2006.01)
*G06F 3/044* (2006.01)

(52) U.S. Cl.
CPC ........ *G02F 1/13338* (2013.01); *G06F 3/0446* (2019.05); *G06F 2203/04111* (2013.01); *H01L 27/3244* (2013.01); *H01L 51/5253* (2013.01)

(58) Field of Classification Search
CPC ......... G06F 3/0412; G06F 2203/04111; G06F 3/0446
See application file for complete search history.

(56) References Cited

U.S. PATENT DOCUMENTS

| | | | |
|---|---|---|---|
| 2013/0100058 | A1 | 4/2013 | Lin et al. |
| 2014/0126131 | A1 | 5/2014 | Lee |
| 2015/0138452 | A1 | 5/2015 | Petacavich |
| 2015/0293629 | A1* | 10/2015 | Ryu .................... G06F 3/0446 345/174 |
| 2016/0154435 | A1 | 6/2016 | Yanagisawa |
| 2018/0159081 | A1 | 6/2018 | Choi et al. |
| 2018/0313982 | A1 | 11/2018 | Bando et al. |

FOREIGN PATENT DOCUMENTS

| | | |
|---|---|---|
| KR | 10-2010-0090056 | 8/2010 |
| KR | 10-2012-0010823 | 2/2012 |
| KR | 10-2014-0057050 | 5/2014 |

\* cited by examiner

DISPLAY APPARATUS HAVING ARBITRARY SHAPE

CROSS-REFERENCE TO RELATED APPLICATION

This application is a Continuation of co-pending U.S. patent application Ser. No. 15/698,265, filed on Sep. 7, 2017, which claims the benefit of Korean Patent Application No. 10-2016-0165169, filed on Dec. 6, 2016, in the Korean Intellectual Property Office, the disclosure of which is incorporated by reference herein in its entirety.

TECHNICAL FIELD

The present disclosure relates to a display apparatus, and more particularly, to a display apparatus having an arbitrary shape.

DISCUSSION OF THE RELATED ART

Some display apparatuses have the ability to, not only display images on a screen, but also, to receive a touch input from a user. These display apparatuses are often referred to as touch-screen displays. These display apparatuses may utilize a touch sensor layer in addition to a display panel which may include light-emitting devices such as organic light emitting diodes (OLEDs).

Such display apparatuses may have a touch sensor layer directly formed on the display panel, or may have a touch sensor layer manufactured in the form of a separate panel that is attached to the display panel. A window layer may be included to protect the display panel and a touch screen. This window layer may be disposed on the touch sensor layer.

SUMMARY

A display apparatus includes a display panel having a display unit. A touch sensor layer is disposed on the display panel. A window layer is disposed on the touch sensor layer. The window layer has a first refractive index and includes a first surface and a second surface opposite the first surface. An insulation layer is disposed between the window layer and the touch sensor layer. The insulation layer has a second refractive index that is greater than the first refractive index.

A display apparatus includes a display panel. A touch sensor layer is disposed on the display panel. An adhesive layer is disposed between the display panel and the touch sensor layer. The adhesive layer has a first refractive index. A window layer is disposed on the touch sensor layer. An insulation layer is disposed between the touch sensor layer and the window layer. The insulation layer has a second refractive index that is greater than the first refractive index.

A touchscreen display apparatus includes a touch-sensitive display panel. A domed window layer is disposed on the touch-sensitive display panel. An insulation layer is disposed between the window layer and the touch-sensitive display panel. The insulation layer has a refractive index that is greater than a refractive index of the window layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
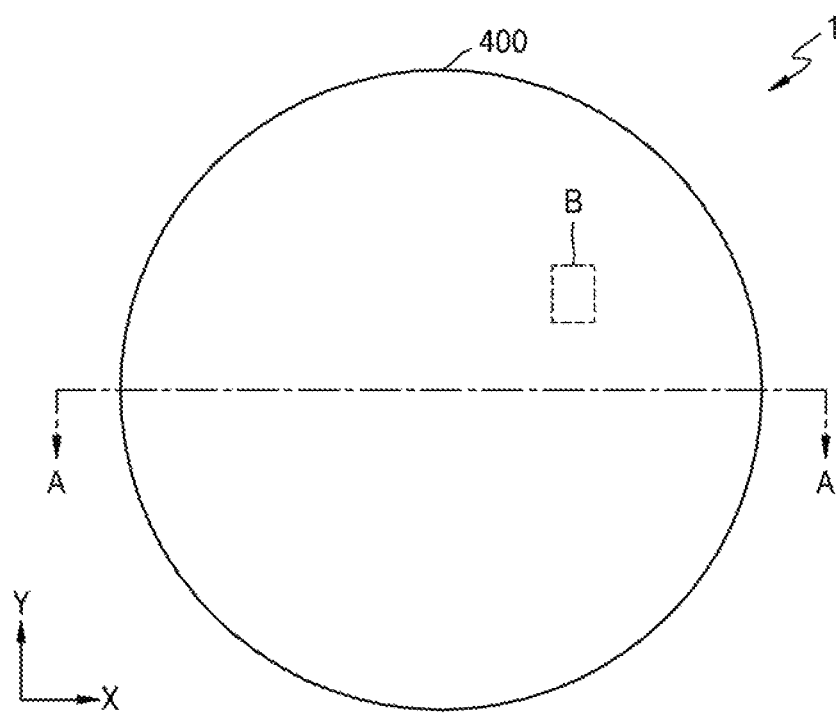
FIG. 1 is a schematic plan view illustrating a display apparatus according to an exemplary embodiment of the present inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Exemplary embodiments of the present inventive concept are described below in detail with reference to the accompanying drawings. Those components that are the same or similar to other components described herein may be assigned the same reference numerals, and redundant explanations are omitted and it may be assumed that those features not described are the same as or similar to those features already described with reference to corresponding features.

It will be understood that although the terms "first", "second", etc. may be used herein to describe various components, these components should not be limited by these terms. These components are only used to distinguish one component from another. As used herein, the singular forms "a", "an" and "the" are intended to include the plural forms as well, unless the context clearly indicates otherwise.

Sizes of elements in the drawings may be exaggerated for convenience of explanation. The present inventive concept is therefore not limited thereto.

Figure 2:
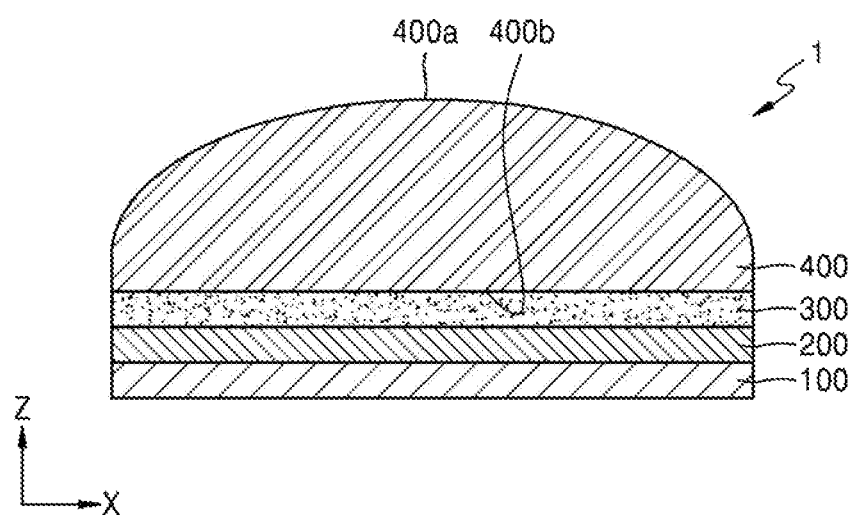
FIG. 2 is a schematic cross-sectional view taken along line A-A of the display apparatus of FIG. 1.

FIG. 1 is a schematic plan view illustrating a display apparatus 1 according to an exemplary embodiment of the present inventive concept. FIG. 2 is a schematic cross-sectional view taken along line A-A of the display apparatus 1 of FIG. 1.

Referring to FIGS. 1 and 2, the display apparatus 1 may have a circular shape. The circular display apparatus 1 may be used in large-sized products, such as televisions (TVs), and in small-sized products, such as mobile phones and wearable devices such as smartwatches. Although the display apparatus 1 is illustrated as having a completely-circular planar shape in FIG. 1, exemplary embodiments of the present inventive concept are not limited thereto. The display apparatus 1 may have any of various shapes, such as an oval, an edge-rounded polygon, and a polygon, including a circle.

Referring to FIG. 2, the display apparatus 1 includes a display panel 100, a touch sensor layer 200 disposed on the display panel 100, a window layer 400 disposed on the touch sensor layer 200, and an insulation layer 300 disposed between the sensor layer 200 and the window layer 400.

The display panel 100 may include a display element that displays an image. According to an exemplary embodiment of the present inventive concept, the display element may be an organic light-emitting device (OLED) 160 of FIG. 3. According to an exemplary embodiment of the present inventive concept, the display element may include a liquid crystal device.

According to an exemplary embodiment of the present inventive concept, the window layer 400 disposed over the display panel 100 has a first surface 400a that is curved. A second surface 400b of the window layer 400 is opposite to the first surface 400a. The second surface 400b may be formed flat, but exemplary embodiments of the present inventive concept are not limited thereto.

Figure 3:
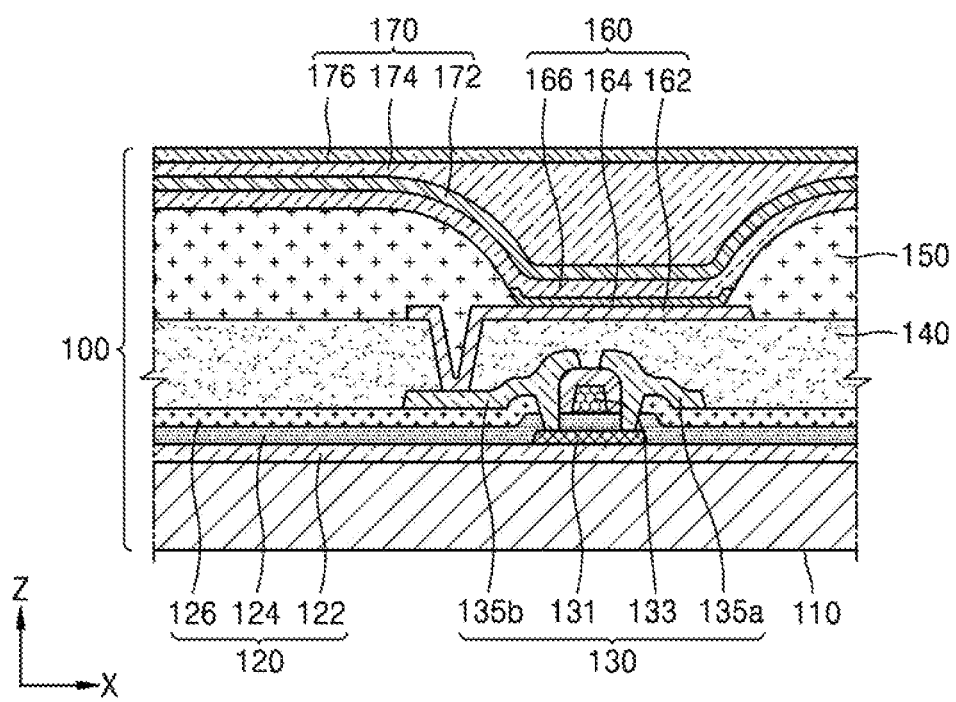
FIG. 3 is a schematic cross-sectional view illustrating a portion of a display panel included in the display apparatus of FIG. 1.

FIG. 3 is a schematic magnified cross-sectional view illustrating a portion B of the display apparatus 1 of FIG. 1.

FIG. 3 schematically illustrates a cross-section of a pixel (or sub-pixel) including the OLED 160.

The display panel 100 may include a substrate 110, the OLED 160 electrically connected to a thin film transistor (TFT) 130 disposed on the substrate 110, and an encapsulation layer 170 encapsulating the OLED 160.

The substrate 110 may include various flexible or bendable materials. For example, the substrate 110 may include a polymer resin, such as polyethersulphone (PES), polyacrylate (PAR), polyetherimide (PEI), polyethyelenen napthalate (PEN), polyethyelenetereptahalate (PET), polyphenylene sulfide (PPS), polyallylate, polyimide (PI), polycarbonate (PC), or cellulose acetate propionate (CAP).

The TFT 130 may be disposed on the substrate 110. The TFT 130 may include a semiconductor layer 131 including amorphous silicon, polycrystalline silicon, or an organic semiconductor material, a gate electrode 133, a source electrode 135a, and a drain electrode 135b.

To secure insulation between the semiconductor layer 131 and the gate electrode 133, a gate insulation layer 124 may be disposed between the semiconductor layer 131 and the gate electrode 133. The gate insulation layer 124 may include an inorganic material, such as silicon oxide, silicon nitride, and/or silicon oxynitride. An interlayer insulation layer 126 may be disposed over the gate electrode 133 and may include an inorganic material, such as silicon oxide, silicon nitride, and/or silicon oxynitride. The source electrode 135a and a drain electrode 135b may be disposed on the interlayer insulation layer 126. An insulation layer including such an inorganic material may be formed via chemical vapor deposition (CVD) or atomic layer deposition (ALD).

A buffer layer 122 may be disposed between the TFT 130 having the aforementioned structure and the substrate 110 and may include an inorganic material, such as, silicon oxide, silicon nitride, and/or silicon oxynitride. The buffer layer 122 may planarize an upper surface of the substrate 110 and/or may prevent or minimize infiltration of impurities from the substrate 110 and the like into the semiconductor layer 131 of the TFT 130.

A planarization layer 140 may be disposed on the TFT 130. For example, when the OLED 160 is disposed over the TFT 130 as illustrated in FIG. 3, the planarization layer 140 may planarize an upper portion of a protection layer that covers the TFT 130. The planarization layer 140 may be formed of an organic material, such as, benzocyclobutene (BCB) or hexamethyldisiloxane (HMDSO). Although the planarization layer 140 is illustrated as a single layer in FIG. 3, various modifications may be made to the planarization layer 140. For example, the planarization layer 140 may include multiple layers.

The OLED 160 may be disposed on the planarization layer 140 and may include a pixel electrode 162, an opposite electrode 166, and an intermediate layer 164 that is disposed between the pixel electrode 162 and the opposite electrode 166 and may include an emission layer. The pixel electrode 162 contacts either the source electrode 135a or the drain electrode 135b via an opening formed in the planarization layer 140, for example, as shown in FIG. 3. The pixel electrode 162 is electrically connected to the TFT 130.

A pixel defining layer 150 may be disposed on the planarization layer 140. The pixel defining layer 150 defines pixels by including respective openings corresponding to sub-pixels, for example, an opening via which a center portion of the pixel electrode 162 is exposed. In a case as illustrated in FIG. 3, the pixel defining layer 150 prevents a current arc or the like from occurring on the edge of the pixel electrode 162 by increasing a distance between the edge of the pixel electrode 162 and the opposite electrode 166 arranged over the pixel electrode 162. The pixel defining layer 150 may be formed of an organic material, for example, polyimide or HMDSO.

The intermediate layer 164 of the OLED 160 may include a low molecular weight material or a high molecular weight material. When the intermediate layer 164 includes a low-molecular weight material, the intermediate layer 164 may have a structure in which a hole injection layer (HIL), a hole transport layer (HTL), an emission layer (EML), an electron transport layer (ETL), and an electron injection layer (EIL) are stacked in a single or complex structure, and may include various organic materials including copper phthalocyanine (CuPc), N,N'-Di(naphthalene-1-yl)-N,N'-diphenyl-benzidine (NPB), and tris-8-hydroxyquinoline aluminum (Alq3). These layers may be formed via vacuum deposition.

When the intermediate layer 164 includes a high-molecular weight material, the intermediate layer 164 may generally include an HTL and an EML. In this case, the HTL may include poly(ethylenedioxythiophene) (PEDOT), and the EML may include a high-molecular weight material such as a polyphenylenevinylene (PPV)-based material or a polyfluorene-based material. The intermediate layer 164 may be formed via screen printing, inkjet printing, laser induced thermal imaging (LITI), or the like.

The intermediate layer 164 is not limited to the structure described above, and may have any of various other structures. The intermediate layer 164 may include a single layer that covers a plurality of pixel electrodes 162 or may include patterned layers respectively corresponding to the plurality of pixel electrodes 162.

The opposite electrode 166 may be disposed on the intermediate layer 164. The opposite electrode 166 may be formed as a single body that constitutes a plurality of OLEDs 160, and thus may correspond to the plurality of pixel electrodes 162.

Because the OLEDs 160 may be easily damaged by external moisture, oxygen, or the like, the encapsulation layer 170 may cover and protect the OLEDs 160. The encapsulation layer 170 may be disposed on the entire surface of the substrate 110 and may extend to the edge of the substrate 110. As illustrated in FIG. 3, the encapsulation layer 170 may include a first inorganic encapsulation layer 172, an organic encapsulation layer 174, and a second inorganic encapsulation layer 176.

The first inorganic encapsulation layer 172 may cover the opposite electrode 166 and may include silicon oxide, silicon nitride, and/or silicon oxynitride. As necessary, other layers, such as, a capping layer, may be interposed between the first inorganic encapsulation layer 172 and the opposite electrode 166.

Because the first inorganic encapsulation layer 172 is formed along structures below the first inorganic encapsulation layer 172, the upper surface thereof might not be flat, as illustrated in FIG. 3. The organic encapsulation layer 174 covers the first inorganic encapsulation layer 172. In contrast with the first inorganic encapsulation layer 172, the organic encapsulation layer 174 may have an approximately flat upper surface. The organic encapsulation layer 174 may include polyethylene terephthalate, polyethylene naphthalate, polycarbonate, polyimide, polyethylene sulfonate, polyoxymethylene, polyarylate, and/or hexamethyldisiloxane.

The second inorganic encapsulation layer 176 may cover the organic encapsulation layer 174 and may include silicon oxide, silicon nitride, and/or silicon oxynitride. The second inorganic encapsulation layer 176 may contact the first inorganic encapsulation layer 172 at the edge of the substrate 110 so that the organic encapsulation layer 174 may be protected from external exposure.

As such, since the encapsulation layer 170 includes the first inorganic encapsulation layer 172, the organic encapsulation layer 174, and the second inorganic encapsulation layer 176, even when the encapsulation layer 170 cracks due to this multi-layered structure, this crack might not extend fully between the first inorganic encapsulation layer 172 and the organic encapsulation layer 174 or between the organic encapsulation layer 174 and the second inorganic encapsulation layer 176. Accordingly, formation of a path via which external moisture, oxygen, or the like is permitted to permeate into a display may be prevented or minimized.

Referring back to FIG. 2, the touch sensor layer 200 may be disposed on the display panel 100 having the above-described structure. Although the touch sensor layer 200 is disposed directly on the display panel 100, as shown in FIG. 2, functional layers, such as a capping layer and an adhesive layer, may be interposed between the display panel 100 and the touch sensor layer 200. The touch sensor layer 200 may be manufactured on a transparent substrate in the form of a separate panel and may be laminated with the display panel 100. Alternatively, the touch sensor layer 200 may be directly formed on the display panel 100.

Meanwhile, the touch sensor layer 200 may include a pattern.

Figure 4:
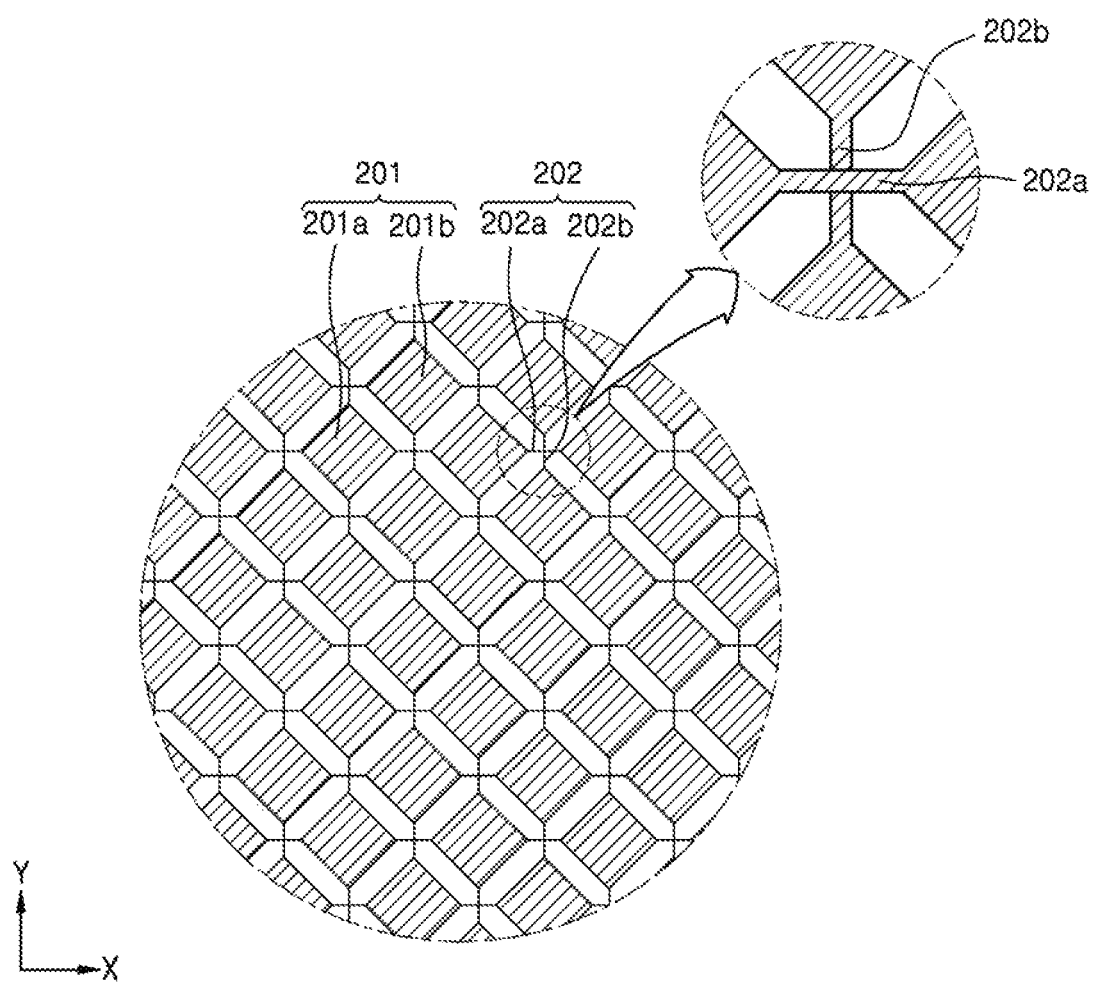
FIG. 4 is a schematic plan view illustrating a touch sensor layer included in the display apparatus of FIG. 1.

FIG. 4 is a schematic plan view illustrating the touch sensor layer 200 of the display apparatus 1 of FIG. 1.

Referring to FIG. 4, the touch sensor layer 200 may include a plurality of sensing patterns 201 and connecting patterns 202 connecting the plurality of sensing patterns 201 to one another. A location detection line may be included in an outer region of the touch sensor layer 200 and may connect the plurality of sensing patterns 201 to an external driving circuit via a pad unit.

According to an exemplary embodiment of the present inventive concept, when the touch sensor layer 200 is included as a separate panel, the sensing patterns 201 and the connecting patterns 202 may be formed on a separate transparent substrate. According to an exemplary embodiment of the present inventive concept, when the touch sensor layer 200 is not included as a separate panel but is formed directly on the display panel 100, the sensing patterns 201 and the connecting patterns 202 may be formed on the encapsulation layer 170.

The plurality of sensing patterns 201 may include first sensing cells 201a connected to one another in a first direction (X-axis direction), and second sensing cells 201b interposed between the first sensing cells 201a not overlapping the first sensing cells 201a and connected to one another in a second direction (Y-axis direction) perpendicular to the first direction (X-axis direction). The first sensing cells 201a and the second sensing cells 201b are alternately spaced apart from each other such that they do not overlap with each other in a touch activating region.

The first direction (X-axis direction) in which the first sensing cells 201a are connected to each other intersects with the second direction (Y-axis direction) in which the second sensing cells 201b are connected to each other. Thus, if the first direction (X-axis direction) is set to be a row direction, the second direction (Y-axis direction) is set to be a column direction.

For example, the first sensing cells 201a are arranged in column lines and/or row lines, and those first sensing cells 201a that are in an identical column or row line (in an identical row line according to the exemplary embodiment shown) are connected to each other in the first direction (X-axis direction) by first connecting patterns 202a arranged in the aforementioned identical column or row line. In this case, each line of first sensing cells 201a connected to each other in the first direction (X-axis direction) is connected to each location detection line.

The second sensing cells 201b are arranged in column lines and/or row lines, and those second sensing cells 201b that are in an identical row or column line (in an identical column line according to the exemplary embodiment shown) are connected to each other in the second direction (Y-axis direction), intersecting with the first direction (X-axis direction), by second connecting patterns 202b arranged in the aforementioned identical row or column line. In this case, each line of second sensing cells 201b connected to each other in the second direction (Y-axis direction) is connected to each location detection line.

The sensing cells 201 are transparent so that they have at least a predetermined transmittance for transmitting light from the display panel 100 to below the sensing cells 201. For example, the first and second sensing cells 201a and 201b may include transparent electrode layers formed of at least a transparent electrode material, such as ITO.

The connecting patterns 202 include a plurality of first connecting patterns 202a formed in the first direction (X-axis direction) connecting the first sensing cells 201a to each other in the first direction (X-axis direction), and a plurality of second connecting patterns 202b formed in the second direction (Y-axis direction) connecting the second sensing cells 201b to each other in the second direction (Y-axis direction).

The connecting patterns 202 are formed of the transparent electrode material used to form the sensing cells 201 or formed of an opaque low-resistance electrode material, but thicknesses or widths of the connecting patterns 202 may be adjusted to prevent them from being seen.

The location detection lines are respectively electrically connected to lines of first sensing cells 201a connected to each other in the first direction (X-axis direction) and lines of second sensing cells 201b connected to each other in the second direction (Y-axis direction), and connect the first and second sensing patterns 201a and 201b to an external driving circuit via a pad unit.

The location detection lines are disposed in a touch-deactivation region defined around the touch-activating region, on which an image is displayed, in order to avoid it from being located in the touch-activating region. Thus, a wide range of materials may be used to form the location detection lines, and accordingly the location detection lines may be formed of not only a transparent electrode material used to form the first and second sensing cells 201a and 201b but also a low-resistance material, such as, molybdenum (Mo), silver (Ag), titanium (Ti), copper (Cu), aluminum (Al), or Mo/Al/Mo.

Although the first and second connecting patterns 202a and 202b intersect with each other in FIG. 4, exemplary embodiments of the present inventive concept are not limited thereto. For example, the first connecting patterns 202a may detour to a path on which the first connecting patterns 202a overlap the second sensing cells 201b adjacent thereto, and may still connect the first sensing cells 201a to each other in the first direction without intersecting with the second connecting patterns 202b. In this case, an insulation layer may be interposed between the first connecting patterns 202a and the second sensing cells 201b to provide stability therebetween.

Referring back to FIG. 2, the display apparatus 1 may include the window layer 400 over the touch sensor layer 200. The window layer 400 may include the first surface 400a and the second surface 400b opposite to the first surface 400a. The first surface 400a of the window layer 400 may be defined as an upper surface that faces the outside of the display apparatus 1, and the second surface 400b opposite to the first surface 400a may be defined as a lower surface that faces the display panel 100.

According to an exemplary embodiment of the present inventive concept, the first surface 400a of the window layer 400 may have a curved shape. The window layer 400 may have a cross-section that is convex in a +z direction, as shown in FIG. 2. The window layer 400 having a convex shape may be understood as the first surface 400a of the window layer 400 having a dome shape or a shape of a convex lens. However, even in this case, the first surface 400a of the window layer 400 may have a shape of a portion of a sphere, for example, a complete dome shape or a shape of a convex lens. According to an exemplary embodiment of the present inventive concept, the first surface 400a may have a so-called 2.5D shape, for example, a shape in which a portion of a window, such as an edge, is curved. As shown in FIG. 2, the second surface 400b of the window layer 400 may be flat, but the shape of the second surface 400b may vary.

The insulation layer 300 having a high refractive index may be interposed between the touch sensor layer 200 and the window layer 400. The insulation layer 300 may be disposed directly below the window layer 400. For example, the insulation layer 300 may contact the second surface 400b of the window layer 400.

The insulation layer 300 may include an adhesive material. The insulation layer 300 may include an adhesive organic material, for example, an optically clear adhesive (OCA), optically clear resin (OCR), or an optical clear film (OCF). The insulation layer 300 may include, for example, Ti, Ta, Yb, and/or oxides thereof, and may include $TiO_2$, $Ta_2O_5$, and/or $Yb_2O_3$. For example, the insulation layer 300 may be formed of $TiO_2$, $Ta_2O_5$, or $Yb_2O_3$, or may be formed by using an adhesive organic material as a base material and mixing the adhesive organic material with $TiO_2$, $Ta_2O_5$, or $Yb_2O_3$ in a powder form. Accordingly, the insulation layer 300 may have a high refractive index.

The window layer 400 may have a first refractive index, and the insulation layer 300 may have a second refractive index. According to an exemplary embodiment of the present inventive concept, the second refractive index of the insulation layer 300 may be greater than the first refractive index of the window layer 400. In this case, the second refractive index of the insulation layer 300 may be n=1.7 or greater. For example, when the first refractive index of the window layer 400 generally has a value of n=1.5 to n=1.6, the second refractive index of the insulation layer 300 may have a value of n=1.7 or greater.

Conventional window layers have a flat upper surface and a flat lower surface. When such flat windows are used, the pattern of the touch sensor layer is not visually recognized by external illumination, such as sunlight or fluorescent light. However, when the window layer has a dome shape of which an upper surface is convex, the window layer serves as a convex lens according to the structural characteristics of a dome, and accordingly the intensity of radiation concentrates and thus the pattern of the touch sensor layer is visually recognized. Thus, the visibility of the display apparatus 1 degrades.

To address this problem, the display apparatus 1, according to an exemplary embodiment of the present inventive concept, includes the insulation layer 300 having a high refractive index disposed between the window layer 400 and the touch sensor layer 200. Because the insulation layer 300 has a higher refractive index than the window layer 400 and accordingly changes a traveling direction of light, the insulation layer 300 may prevent the intensity of radiation from concentrate via the domes-shaped window, and may increase the visibility of the display apparatus 1.

Figure 5:
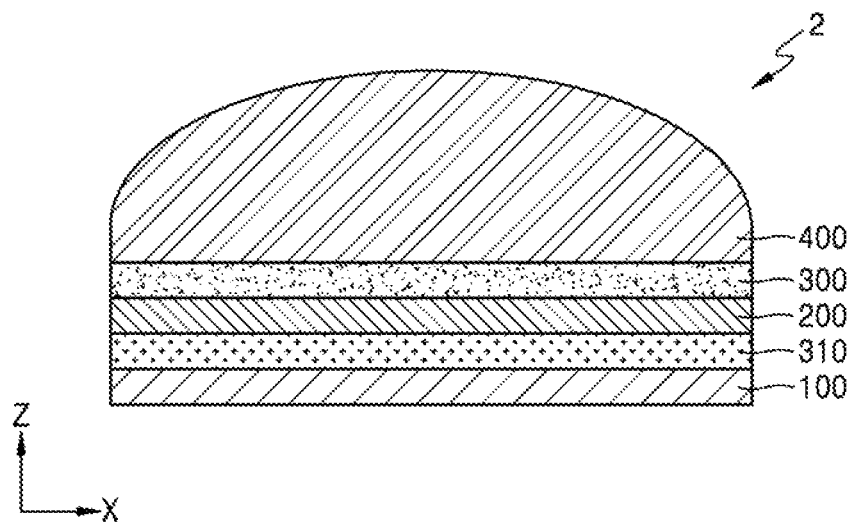
FIG. 5 is a schematic cross-sectional view illustrating a display apparatus according to an exemplary embodiment of the present inventive concept.

FIG. 5 is a schematic cross-sectional view illustrating a display apparatus 2 according to an exemplary embodiment of the present invention.

The display apparatus 2 of FIG. 5 may be different from the display apparatus 1 described above in that a first adhesive layer 310 is disposed between the display panel 100 and the touch sensor layer 200. The other components may be substantially the same as those of the display apparatus 1 described above.

Referring to FIG. 5, the display apparatus 2 may include the first adhesive layer 310 disposed between the display panel 100 and the touch sensor layer 200. The first insulation layer 310 may be formed of, for example, an OCA, OCR, or an OCF.

The first adhesive layer 310 may have a smaller refractive index than the second refractive index of the insulation layer 300. As described above, the second refractive index of the insulation layer 300 may have a value of n=1.7 or greater, and the refractive index of the first adhesive layer 310 may have a value of, for example, n=1.5 to n=1.6. The refractive index of the first adhesive layer 310 may be similar to the first refractive index of the window layer 400.

Figure 6:
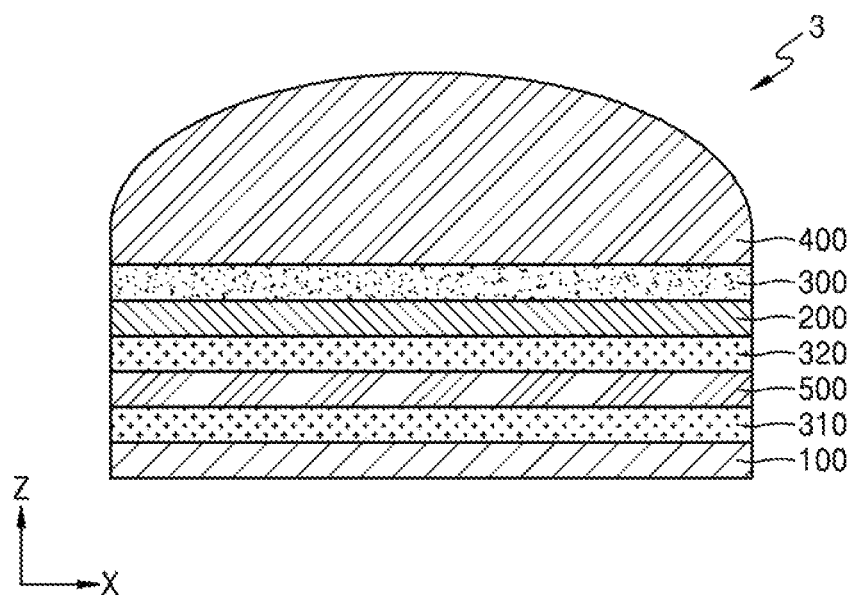
FIG. 6 is a schematic cross-sectional view illustrating a display apparatus according to an exemplary embodiment of the present inventive concept.

FIG. 6 is a schematic cross-sectional view illustrating a display apparatus 3 according to an exemplary embodiment of the present inventive concept.

Other components may be the same as those of the display apparatus 1.

The first adhesive layer 310 and a second adhesive layer 320 may be formed of, for example, an OCA, OCR, or an OCF. The first and second adhesive layers 310 and 320 may have smaller refractive indices than the second refractive index of the insulation layer 300. As described above, the second refractive index of the insulation layer 300 may have a value of n=1.7 or greater, and the refractive indices of the first and second adhesive layers 310 and 320 may have values of, for example, n=1.5 to n=1.6. The refractive indices of the first and second adhesive layers 310 and 320 may be similar to the first refractive index of the window layer 400.

The display apparatus 3 may include a polarization layer 500 disposed between the first and second adhesive layers 310 and 320. The polarization layer 500 may prevent or otherwise reduce reflection of external/ambient light. The polarization layer 500 may be implemented as a polarization film to be bonded with the display panel 100 by the first adhesive layer 310 and to be bonded with the touch sensor layer 200 by the second adhesive layer 320. For example, the polarization film has a shape in which protection layers implemented as tri-acetate cellulose (TAC) films are respectively bonded with both surfaces of a polarization element implemented as a Poly Vinyl Alcohol (PVA) film colored with a dichroic material, wherein the protection layers act as a protector of the polarization element. This shape is referred to herein as a three-layered structure of TAC-PVA-TAC. A surface of the TAC film functioning as a protection layer may be coated via a surface coating process having characteristics, such as scattering, hardness enhancement, non-reflection, and low reflection.

Figure 7:
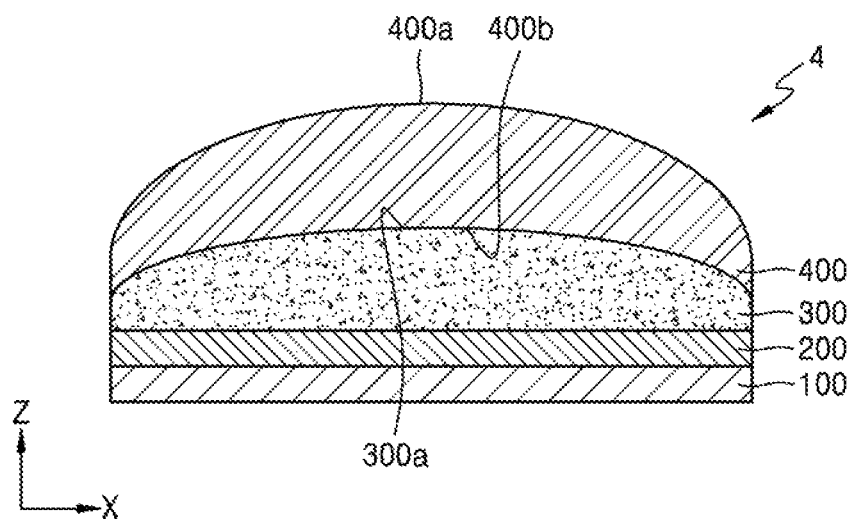
FIG. 7 is a schematic cross-sectional view illustrating a display apparatus according to an exemplary embodiment of the present inventive concept.

FIG. 7 is a schematic cross-sectional view illustrating a display apparatus 4 according to an exemplary embodiment of the present inventive concept.

The display apparatus 4 of FIG. 7 is different from the display apparatuses 1, 2, and 3 in terms of the cross-sectional shapes of the window layer 400 and the insulation layer 300 that contacts the window layer 400. The other components may be the same as those of the display apparatus 1.

Referring to FIG. 7, the display apparatus 4 includes a display panel 100, a touch sensor layer 200 disposed on the display panel 100, a window layer 400 disposed on the touch sensor layer 200, and an insulation layer 300 disposed between the sensor layer 200 and the window layer 400.

The display apparatus 4 may include a window layer 400 having a first surface 400a and a second surface 400b opposite to the first surface 400a. Both the first and second surfaces 400a and 400b of the window layer 400 may be curved.

First, the first surface 400a of the window layer 400 may have a cross-section that is convex in the +z direction, as described above. For example, the first surface 400a of the window layer 400 may be understood as having a dome shape or a convex lens shape that is outwardly convex. However, even in this case, the first surface 400a of the window layer 400 may have a shape of a portion of a sphere, for example, a complete dome shape or a shape of a convex lens. According to an exemplary embodiment of the present invention, the first surface 400a may have a so-called 2.5D shape, for example, a shape in which a portion of a window, such as an edge, is curved.

The second surface 400b of the window layer 400 may have a shape that is convex in the +z direction toward the first surface 400a. For example, similar to the first surface 400a, the second surface 400b may be understood as having a dome shape or a shape of a convex lens that is convex outwards. In this case, a radius of curvature of the second surface 400b of the window layer 400 may be less than or equal to that of the first surface 400a of the window layer 400.

An upper surface of the insulation layer 300 disposed below the window layer 400 to be in contact with the window layer 400 may have a shape that is convex in the +z direction, which is towards the window layer 400, along the shape of the second surface 400b of the window layer 400.

The display apparatus 4 may include an adhesive layer disposed between the display panel 100 and the touch sensor layer 200, as described above. According to an exemplary embodiment of the present inventive concept, an adhesive layer may be disposed between the touch sensor layer 200 and the window layer 400. According to an exemplary embodiment of the present inventive concept, a polarization plate may be disposed between the display panel 100 and the touch sensor layer 200, and an adhesive layer may be disposed between the display panel 100 and the touch sensor layer 200 to bond the polarization plate to the display panel 100 and/or the touch sensor layer 200.

Since the display apparatus 4 may include the window layer 400 having the first surface 400a and the second surface 400b that are both curved, the window layer 400 may function as a lens. Accordingly, a viewing angle that is recognized by a user is expanded, and thus the screen may look magnified to the user.

Figure 8:
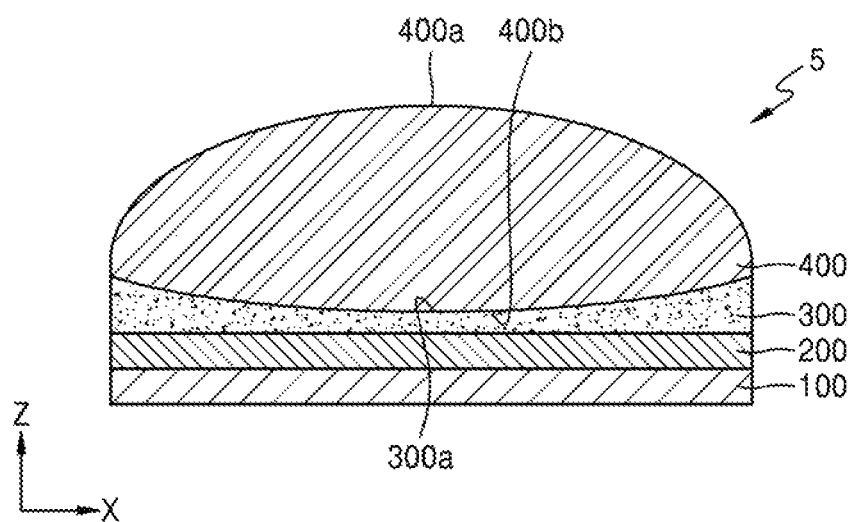
FIG. 8 is a schematic cross-sectional view illustrating a display apparatus according to an exemplary embodiment of the present inventive concept.

FIG. 8 is a cross-sectional view illustrating a display apparatus 5 according to an exemplary embodiment of the present invention.

The display apparatus 5 of FIG. 8 is different from the display apparatuses 1, 2, 3, and 4 in terms of the cross-sectional shapes of the window layer 400 and the insulation layer 300 that contacts the window layer 400. The other components may be the same as those of the display apparatus 1 described above.

Referring to FIG. 8, the display apparatus 5 includes a display panel 100, a touch sensor layer 200 disposed on the display panel 100, a window layer 400 disposed on the touch sensor layer 200, and an insulation layer 300 disposed between the sensor layer 200 and the window layer 400.

The display apparatus 5 may include a window layer 400 having a first surface 400a and a second surface 400b opposite to the first surface 400a. Both the first and second surfaces 400a and 400b of the window layer 400 may be curved.

First, the first surface 400a of the window layer 400 may have a cross-section that is convex in the +z direction, as described above. For example, the first surface 400a of the window layer 400 may be understood as having a dome shape or a convex lens shape that is outwardly convex. However, even in this case, the first surface 400a of the window layer 400 may have a shape of a portion of a sphere, that is, a complete dome shape or a shape of a convex lens. According to an exemplary embodiment of the present inventive concept, the first surface 400a may have a so-called 2.5D shape, for example, a shape in which a portion of a window, such as an edge, is curved.

The second surface 400b of the window layer 400 may have a shape that is convex in a −z direction opposite to the +z direction toward the first surface 400a. For example, the second surface 400b of the window layer 400 may be understood as having a dome shape or a shape of a convex lens that is convex in the direction toward the display panel 100. In this case, a radius of curvature of the second surface 400b of the window layer 400 may be less than or equal to that of the first surface 400a of the window layer 400.

An upper surface of the insulation layer 300 disposed below the window layer 400 to be in contact with the window layer 400 may have a shape that is concave in the +z direction, which is toward the window layer 400, along the shape of the second surface 400b of the window layer 400.

The display apparatus 5 may include an adhesive layer disposed between the display panel 100 and the touch sensor layer 200, as in the aforementioned embodiments. According to an exemplary embodiment of the present inventive concept, an adhesive layer may be disposed between the touch sensor layer 200 and the window layer 400. According to an exemplary embodiment of the present inventive concept, a polarization plate may be disposed between the display panel 100 and the touch sensor layer 200, and an adhesive layer may be disposed between the display panel 100 and the touch sensor layer 200 to bond the polarization plate to the display panel 100 and/or the touch sensor layer 200.

Since the display apparatus 5 includes the window layer 400 having the first surface 400a and the second surface 400b that are both curved, the window layer 400 may function as a lens. Accordingly, a viewing angle that is recognized by a user is expanded, and thus the screen may look magnified.

Figure 9:
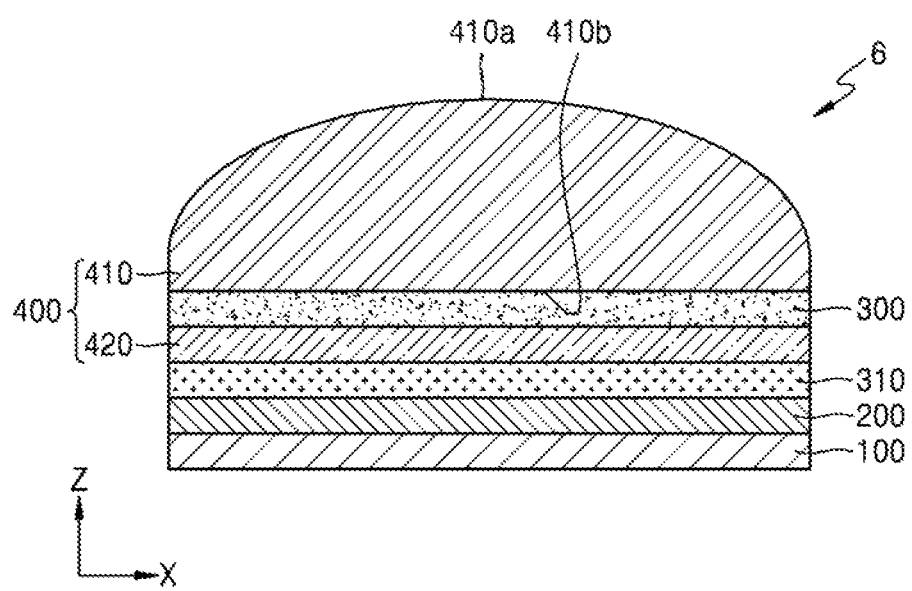
FIG. 9 is a schematic cross-sectional view illustrating a display apparatus according to an exemplary embodiment of the present inventive concept.

FIG. 9 is a cross-sectional view illustrating a display apparatus 6 according to an exemplary embodiment of the present inventive concept.

The display apparatus 6 of FIG. 9 is different from the display apparatuses 1, 2, 3, 4, and 5 in terms of the structures of the window layer 400 and the insulation layer 300 that contacts the window layer 400. The other components may be the same as those of the display apparatus 1 discussed above.

Referring to FIG. 9, the display apparatus 6 includes a display panel 100, a touch sensor layer 200 disposed on the display panel 100, a first window layer 410 and a second window layer 420 stacked over the touch sensor layer 200, and an insulation layer 300 disposed between the first window layer 410 and the second window layer 420.

The first window layer 410 and the second window layer 420 included in the display apparatus 6 constitute a window layer 400. For example, the window layer 400 may have a multi-layered structure in which the first window layer 410 and the second window layer 420 are stacked on each other.

An upper surface 410a of the first window layer 410 may have an outwardly-convex shape. For example, the upper surface 410a of the first window layer 410 may be understood as having a dome shape or a shape of a convex lens that is convex in the +z direction which is a direction opposite to the direction toward the display panel 100. However, in this case, the upper surface 410a of the first window layer 410 may have a shape of a portion of a sphere, for example, a complete dome shape or a shape of a convex lens. According to an exemplary embodiment of the present inventive concept, the first surface 400a may have a so-called 2.5D shape, for example, a shape in which a portion of a window, such as an edge, is curved. A lower surface 410b of the first window layer 410 may be flat.

The second window layer 420 may be disposed between the first window layer 410 and the touch sensor layer 200, and, as shown in FIG. 9, may have an entirely flat form.

An insulating layer 300 having a high refractive index may be interposed between the first window layer 410 and the second window layer 420. The insulation layer 300 may be directly interposed between the first window layer 410 and the second window layer 420 and may contact one surface the first window layer 410 and one surface of the second window layer 420. The insulation layer 300 is a film having a high refractive index, and may be disposed between the first window layer 410 and the second window layer 420.

According to an exemplary embodiment of the present inventive concept, the insulation layer 300 may include an adhesive material. The insulation layer 300 may include an adhesive organic material, for example, an OCA, OCR, or an OCF. The insulation layer 300 may include, for example, Ti, Ta, Yb, and/or oxides thereof, and may include $TiO_2$, $Ta_2O_5$, and/or $Yb_2O_3$. For example, the insulation layer 300 may be formed of $TiO_2$, $Ta_2O_5$, or $Yb_2O_3$, or may be formed by using an adhesive organic material as a base material and mixing the adhesive organic material with $TiO_2$, $Ta_2O_5$, or $Yb_2O_3$ in a powder form. Accordingly, the insulation layer 300 may have a high refractive index.

The first window layer 410 may have a first refractive index, and the insulation layer 300 may have a second refractive index. A refractive index of the second window layer 420 may be similar to the first refractive index of the first window layer 410. The second refractive index of the insulation layer 300 may be greater than the first refractive index of the first window layer 410. In this case, the second refractive index of the insulation layer 300 may be $n=1.7$ or greater. For example, when the first refractive index of the first window layer 410 has a value of $n=1.5$ to $n=1.6$, the second refractive index of the insulation layer 300 may have a value of $n=1.7$ or greater.

Conventional window layers may have a flat upper surface and a flat lower surface. When such flat windows are used, the pattern of the touch sensor layer might not be visible in external illumination, such as sunlight or fluorescent light. However, when the window layer has a dome shape of which an upper surface is convex, the window layer serves as a convex lens according to the structural characteristics of a dome, and accordingly the intensity of radiation concentrates and thus the pattern of the touch sensor layer may be seen. Thus, the visibility of the display apparatus degrades.

The display apparatus 6 according to an exemplary embodiment of the present inventive concept may include the insulating layer 300 having a high refractive index between the window layer 400 and the touch sensor layer 200. Because the insulating layer 300 has a higher refractive index than the window layer 400 and accordingly changes a traveling direction of light, the insulating layer 300 may prevent the intensity of radiation from concentrating via the domes-shaped window, and may increase the visibility of the display apparatus 6.

Figure 10:
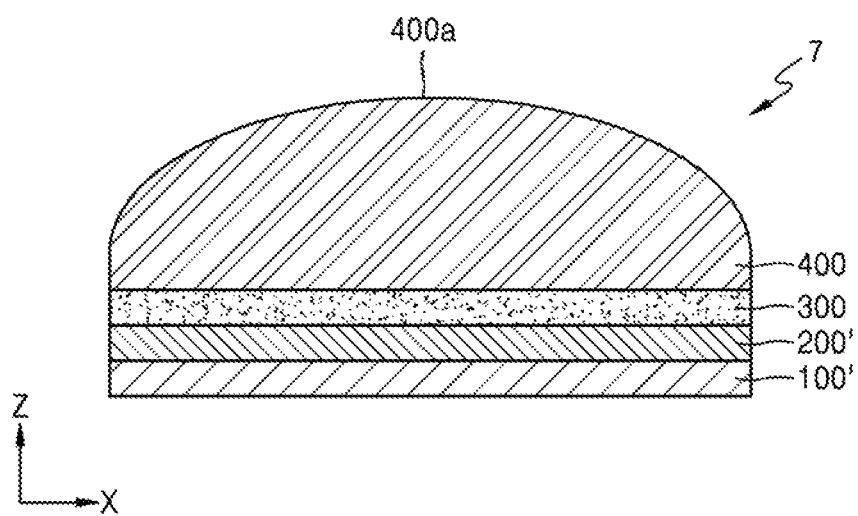
FIG. 10 is a schematic cross-sectional view illustrating a display apparatus according to an exemplary embodiment of the present inventive concept.
Figure 11:
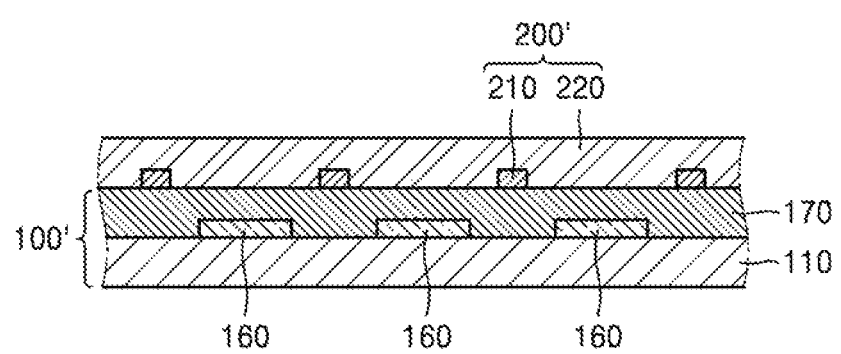
FIG. 11 is a schematic cross-sectional view magnifying and illustrating portions of a display unit and a touch sensor layer included in the display apparatus of FIG. 10.
Figure 12:
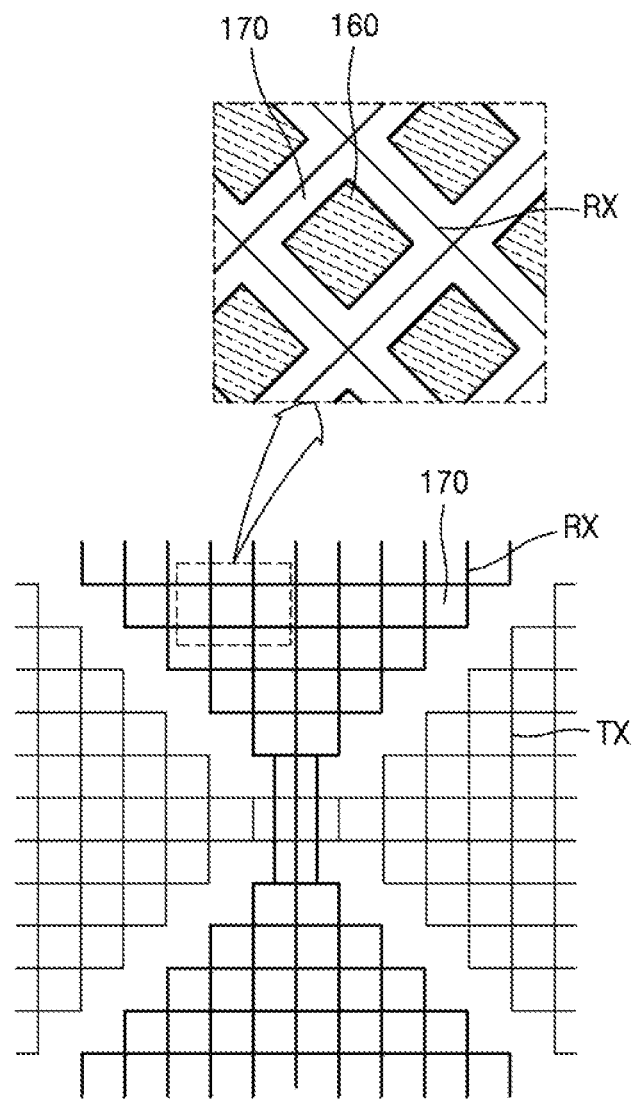
FIG. 12 is a schematic plan view illustrating a portion of the touch sensor layer included in the display apparatus of FIG. 10.

FIG. 10 is a schematic cross-sectional view illustrating a display apparatus 7 according to an exemplary embodiment of the present inventive concept. FIG. 11 is a schematic cross-sectional view magnifying and illustrating portions of a display panel and a touch sensor layer of the display apparatus 7 of FIG. 10. FIG. 12 is a schematic plan view of a portion of the touch sensor layer of the display apparatus 7 of FIG. 10.

Referring to FIG. 10, the display apparatus 7 includes a display panel 100', a touch sensor layer 200' disposed on the display panel 100', a window layer 400 disposed on the touch sensor layer 200', and an insulation layer 300 disposed between the sensor layer 200' and the window layer 400.

The display panel 100' and the touch sensor layer 200' may be integrated with each other. The display panel 100' and the touch sensor layer 200' being be integrated with each other may be understood as the touch sensor layer 200' being built into the display panel 100' by forming the touch sensor layer 200' directly on the display panel 100', instead of using an add-on method of forming the display panel 100' and the touch sensor layer 200' separately and attaching them to each other.

Referring to FIG. 11, the display panel 100' may include a plurality of organic light-emitting devices 160 arranged on a substrate 110, and an encapsulation layer 170 covering the organic light-emitting devices 160. The touch sensor layer 200' may be disposed directly on the encapsulation layer 170.

The substrate 110 may include various flexible or bendable materials. For example, the substrate 110 may be formed of polyethylene naphthalate (PEN), polyethylene terephthalate (PET), or polyimide (PI). The plurality of organic light-emitting devices 160 may be arranged on the substrate 110. Although the plurality of organic light-emitting devices 160 are disposed directly on the substrate 110 in FIG. 11, various types of layers including a device, such as, a TFT, may be interposed between the plurality of organic light-emitting devices 160 and the substrate 110. The encapsulation layer 170 may be disposed on the plurality of organic light-emitting devices 160 such that it covers the plurality of organic light-emitting devices 160. The display panel 100' may have the same detailed structure as the display panel 100 described above.

The touch sensor layer 200' includes a touch electrode 210 and an insulation layer 220 and may be disposed directly on the encapsulation layer 170. Referring to FIG. 11, the touch electrode 210 may be disposed on the encapsulation layer 170, and the insulation layer 220 may cover the touch electrode 210. Referring back to FIG. 2, the encapsulation layer 170 has a structure in which the first inorganic encapsulation layer 172, the organic encapsulation layer 174, and the second inorganic encapsulation layer 176 are sequentially stacked. Thus, the touch electrode 210 may be understood as being formed on the second inorganic encapsulation layer 176. According to an exemplary embodiment of the present inventive concept, a separate functional layer may be interposed between the touch electrode 210 and the second inorganic encapsulation layer 176.

The touch electrode 210 may have a planar mesh form as shown in FIG. 12. The touch electrode 210 may be formed of an opaque conductive layer, and may include low-resistance metal, such as Ag, Al, Cu, chromium (Cr), or nickel (Ni), and a conductive nano material, such as Ag nanowires or carbon nanotubes (CNTs).

The touch electrode 210 may be disposed between the plurality of organic light-emitting devices 160, and may include a plurality of first sensing electrodes Rx and a plurality of second sensing electrodes Tx. The plurality of first sensing electrodes Rx may be transmitter touch electrodes to which a first touch signal is transmitted, and the plurality of second sensing electrodes Tx may be receiver touch electrodes to which a second touch signal is transmitted.

Referring back to FIG. 10, the window layer 400 of which the upper surface 400a has a curved or dome shape may be disposed over the touch sensor layer 200'. An insulation layer 300 having a high refractive index of n=1.7 or greater may be interposed between the touch sensor layer 200' and the window layer 400. The window layer 400 and the insulation layer 300 may be the same as those described above.

Conventional window layers may have a flat upper surface and a flat lower surface. When such flat windows are used, the pattern of the touch sensor layer might not be noticeable in the presence of external illumination, such as sunlight or fluorescent light. However, when the window layer has a dome shape of which an upper surface is convex, the window layer serves as a convex lens according to the structural characteristics of a dome, and accordingly the intensity of radiation concentrates and thus the pattern of the touch sensor layer is visually recognized. Thus, the visibility of the display apparatus degrades.

The display apparatus 7 according to exemplary embodiments of the present inventive concept includes the insulating layer 300 having a high refractive index disposed between the window layer 400 and the touch sensor layer 200'. Because the insulating layer 300 has a higher refractive index than the window layer 400 and accordingly changes a traveling direction of light, the insulating layer 300 may prevent the intensity of radiation from concentrate via the domes-shaped window, and may increase the visibility of the display apparatus 7.

According to an exemplary embodiment of the present inventive concept, as described above, a display apparatus having increased visibility may be realized. However, the scope of the present invention is not limited thereto.

While the inventive concept has been particularly shown and described with reference to exemplary embodiments thereof, it will be understood by those of ordinary skill in the art that various changes in form and details may be made therein without departing from the spirit and scope of the present disclosure.

What is claimed is:

1. A display apparatus, comprising:
   a display panel;
   a touch sensor layer disposed on the display panel;
   a window layer disposed on the touch sensor layer, the window layer comprising a first surface and a second surface opposite the first surface; and
   an insulation layer disposed between the window layer and the touch sensor layer,
   wherein the first surface of the window layer is curved outwardly in a direction away from the display panel and the second surface of the window layer is curved upwardly in a direction away from the display panel.

2. The display apparatus of claim 1, wherein the window layer has a meniscus shape.

3. The display apparatus of claim 2, wherein the first surface of the window layer has a dome shape.

4. The display apparatus of claim 1, wherein the insulation layer is adhesive.

5. The display apparatus of claim 1, wherein the insulation layer comprises an organic material.

6. The display apparatus of claim 1, wherein the insulation layer comprises at least one selected from Ti, Ta, Yb, an oxide of Ti, an oxide of Ta, or an oxide of Yb.

7. The display apparatus of claim 1, wherein an upper surface of the insulation layer conforms to a shape of the second surface of the window layer.

8. The display apparatus of claim 1, wherein the window layer has a circular Shape in a plan view.

9. The display apparatus of claim 1, wherein a radius of curvature of the second surface of the window layer is less than or equal to a radius of curvature of the first surface of the window layer.

10. A display apparatus, comprising:
a display panel;
a touch sensor layer disposed on the display panel;
a window layer disposed on the touch sensor layer, the window layer comprising a first surface and a second surface opposite the first surface; and
an insulation layer disposed between the window layer and the touch sensor layer,
wherein the first surface of the window layer is curved outwardly in a direction away from the display panel and the second surface of the window layer is curved downwardly in a direction toward the display panel.

11. The display apparatus of claim 10, wherein the window layer has a biconvex shape.

12. The display apparatus of claim 11, wherein the first surface of the window layer has a dome shape.

13. The display apparatus of claim 10, wherein the insulation layer is adhesive.

14. The display apparatus of claim 10, wherein the insulation layer comprises an organic material.

15. The display apparatus of claim 10, wherein the insulation layer comprises at least one selected from Ti, Ta, Yb, an oxide of Ti, an oxide of Ta, or an oxide of Yb.

16. The display apparatus of claim 10, wherein an upper surface of the insulation layer conforms to a shape of the second surface of the window layer.

17. The display apparatus of claim 10, wherein the window layer has a circular shape in a plan view.

18. The display apparatus of claim 10, wherein a radius of curvature of the second surface of the window layer is less than or equal to a radius of curvature of the first surface of the window layer.

19. A display apparatus, comprising:
a display panel;
a touch sensor layer disposed on the display panel;
a window layer disposed on the touch sensor layer, the window layer comprising a first surface and a second surface opposite the first surface;
an insulation layer disposed between the window layer and the touch sensor layer; and
a first adhesive layer disposed between the display panel and the touch sensor layer, wherein a refractive index of the first adhesive layer is less than a refractive index of the insulation layer.

20. The display apparatus of claim 19, further comprising: a polarization layer disposed between the display panel and the touch sensor layer, and a second adhesive layer disposed between the touch sensor layer and the polarization layer.

21. The display apparatus of claim 20, wherein the first adhesive layer is disposed between the display panel and the polarization layer.

22. The display apparatus of claim 21, wherein a refractive index of the second adhesive layer is less than the refractive index of the insulation layer.

23. The display apparatus of claim 21, wherein the refractive indices of the first adhesive layer and the second adhesive layer are substantially the same as a refractive index of the window layer.

24. The display apparatus of claim 19, wherein the first surface of the window layer is curved outwardly in a direction away from the display panel.

25. The display apparatus of claim 24, wherein the first surface of the window layer has a dome shape.

26. The display apparatus of claim 24, wherein the first surface of the window layer has a 2.5D shape.

* * * * *